(12) United States Patent
Lee et al.

(10) Patent No.: US 7,535,270 B2
(45) Date of Patent: May 19, 2009

(54) SEMICONDUCTOR MEMORY DEVICE

(75) Inventors: Hyun-Woo Lee, Kyoungki-do (KR); Won-Joo Yun, Kyoungki-do (KR)

(73) Assignee: Hynix Semiconductor, Inc., Gyeongg-do (KR)

( * ) Notice: Subject to any disclaimer, the term of this patent is extended or adjusted under 35 U.S.C. 154(b) by 133 days.

(21) Appl. No.: 11/819,783

(22) Filed: Jun. 29, 2007

(65) Prior Publication Data

US 2008/0054964 A1    Mar. 6, 2008

(30) Foreign Application Priority Data

Aug. 31, 2006    (KR) .................... 10-2006-0083560

(51) Int. Cl.
*H03L 7/06*    (2006.01)

(52) U.S. Cl. .................. 327/147; 327/156; 327/149; 327/158

(58) Field of Classification Search ........... 327/147, 327/149, 150, 156, 158, 159
See application file for complete search history.

(56) References Cited

U.S. PATENT DOCUMENTS

| | | | | |
|---|---|---|---|---|
| 5,889,723 | A * | 3/1999 | Pascucci | 365/229 |
| 6,294,938 | B1 * | 9/2001 | Coddington et al. | 327/158 |
| 6,707,330 | B2 * | 3/2004 | Nakanishi | 327/158 |
| 2006/0193419 | A1 * | 8/2006 | Maneatis et al. | 375/376 |
| 2006/0220714 | A1 * | 10/2006 | Hur | 327/175 |

FOREIGN PATENT DOCUMENTS

| KR | 10-2001-0094529 A | 11/2001 |
|---|---|---|
| KR | 10-2004-0021478 A | 3/2004 |
| KR | 10-2005-0097700 A | 10/2005 |

OTHER PUBLICATIONS

Korean Notice of Allowance issued in Korean Patent Application No. KR 10-2006-0083560, dated Jul. 30, 2008.

* cited by examiner

*Primary Examiner*—Matthew C Landau
*Assistant Examiner*—Sibin Chen
(74) *Attorney, Agent, or Firm*—Mannava & Kang, P.C.

(57) ABSTRACT

A semiconductor memory device includes a delay locked loop for correcting a duty cycle rate of a delay locked clock signal. The semiconductor memory device includes a delay locked circuit, a duty cycle correction circuit, and a clock synchronization circuit. The delay locked circuit outputs a delay locked clock by delaying a system clock by a predetermined time. The duty cycle correction circuit outputs a first clock by correcting a duty cycle of the delay locked clock, wherein the proportion of high to low level periods of the delay locked clock is controlled according to a time difference between a second edge of the first clock and that of a second clock derived from the first clock. The clock synchronization circuit synchronizes a first edge of the first clock with that of the second clock.

12 Claims, 5 Drawing Sheets

SEMICONDUCTOR MEMORY DEVICE

CROSS-REFERENCE TO RELATED APPLICATIONS

The present invention claims priority of Korean patent application no. 10-2006-0083560, filed in the Korean Patent Office on Aug. 31, 2006, which is incorporated by reference in its entirety.

BACKGROUND OF THE INVENTION

The present invention relates to a semiconductor memory device, more particularly, to a delay locked loop of a semiconductor memory device.

A semiconductor memory device is an apparatus for storing data. When a data processing device such as a central processing unit (CPU) requests data, a semiconductor memory device outputs data stored where an address input from the data processing device indicates. On the other hand, a semiconductor memory device stores data supplied from a data processing device where an address input from the data processing device indicates.

As a system including a plurality of semiconductor memory devices needs to operate at higher speed, semiconductor memory devices are also required to output or store data at higher speed. It has been achieved by development of technology in reference to a semiconductor integrated circuit. In order to input/output a data at high speed, a synchronous memory device which is able to input/output data synchronized with a system clock was developed. Furthermore, a double data rate (DDR) synchronous memory device which is able to input/output a data at rising and falling edges of a system clock was developed in order to more increase an input/output speed of data.

Because inputting or outputting data at rising and falling edges of the system clock, the DDR synchronous memory device processes data twice during one period of the system clock. Particularly, the DDR synchronous memory device should output data whose output timing is accurately synchronized with a rising or a falling edge of the system clock. The DDR synchronous memory device includes a data output circuit for outputting a data synchronized with a rising or a falling edge of the system clock.

However, a system clock input into a semiconductor memory device is inevitably delayed by internal devices of the semiconductor memory device such as a clock input buffer and a transmitting line and transmitted to a data output circuit. Accordingly, if the data output circuit synchronizes a data with the delayed clock, an external device for receiving the data from the semiconductor memory device becomes to process an asynchronous data with a rising or falling edge of the system clock.

A semiconductor memory device is provided with a delay locked loop (DLL) for locking a delay of a system clock input to the semiconductor memory device, in order to solve above problem. The DDL is a circuit for compensating a delay time of the system clock. The delay time is time taken for the system clock to be transmitted to a data output circuit after input into the semiconductor memory device. The DLL finds how long it takes for the system clock to be delayed by the clock input buffer and the transmitting line. The DLL delays the system clock by a delay time corresponding to finding and outputs a delayed system clock to the data output circuit. That is, the system clock input to the semiconductor memory device, whose delay time is constantly locked by the DLL, is transmitted to the data output circuit. The data output circuit outputs data synchronized with a delay locked system clock. An external device accepts the data as accurately synchronized with the system clock input into the semiconductor memory device.

At a real operation, the delay locked system clock output from the DLL is transmitted to an output buffer at the time of a clock earlier than an output timing of data. And then, the data is outputted in synchronization with the delay locked system clock. Accordingly, the external device receives the data accurately in synchronization with a rising or a falling edge of the system clock input into the semiconductor memory device. The DLL is a device for finding how much earlier a data is outputted, in order to compensate the delay of the system clock input into the semiconductor memory device.

FIG. 1 is a signal timing diagram illustrating an operation of a conventional delay locked loop (DLL).

A DLL outputs a delay locked clock signal DLL_OUT being enabled earlier than an input clock signal CLKI by a predetermined time. A semiconductor memory device synchronizes data D0, D1 and D2 with the delay locked clock signal DLL_OUT and outputs them. When the semiconductor memory device outputs the data D0, D1 and D2 as above, an external device receives the data D0, D1 and D2 synchronized with a system clock signal CLK0.

Meanwhile, as a clock signal is inputted into the semiconductor memory device with a higher frequency, an operation margin necessary for the synchronous memory device to input or output a data at rising and falling edges of the clock signal decreases. Accordingly, it becomes more important for the semiconductor memory device to correct a duty cycle rate of the delay locked clock signal outputted from the DLL. The reason is because the operation margin for a semiconductor memory device to process data can be secured maximally when the duty cycle rate of the delay locked clock signal is in the proportion of 50 and 50. A DLL recently provided to a semiconductor memory device includes a circuit for correcting a duty cycle rate of an input clock signal.

However, it becomes more difficult for the DLL to output delay locked clock signal having a corrected duty cycle rate in spite of variation of an operation temperature, a supply voltage and a manufacture condition, because of an increase of a clock signal frequency. Unless the delay locked clock signal has the corrected duty cycle rate, an operation margin is insufficient at one of the rising and falling edges of the clock signal. The semiconductor memory device is not able to process data at a predetermined time.

SUMMARY OF THE INVENTION

Embodiments of the present invention are directed to providing a semiconductor memory device including a delay locked loop for correcting a duty cycle rate of a delay locked clock signal.

In accordance with an aspect of the present invention, a semiconductor memory device includes a delay locked circuit for outputting a delay locked clock by delaying a system clock for a predetermined time, a duty cycle correction circuit for outputting a first clock by correcting a duty cycle of the delay locked clock, wherein the proportion of high to low level periods of the delay locked clock is controlled according to a time difference between a second edge of the first clock and that of a second clock derived from the first clock; and a clock synchronization circuit for synchronizing a first edge of the first clock with that of the second clock.

In accordance with another aspect of the present invention, a semiconductor memory device includes a first phase comparison unit for comparing a system clock with a feedback clock, a first delay line for outputting a delay locked clock by delaying the system clock for a predetermined time, a delay line control unit for controlling a delay time of the first delay line according to the comparison result of the first phase comparison unit, a duty cycle correction unit for controlling the proportion of high to low level periods of the delay locked clock in response to duty cycle control signals, thereby outputting a first clock, a replica delay unit for delaying the first clock for a modeling delay time, thereby outputting the feedback clock, a clock synchronization circuit for synchronizing a first edge of the first clock with that of a second clock derived from the first clock, and a duty cycle correction control unit for controlling the duty cycle correction unit according to a time difference between a second edge of the first clock and that of the second clock.

In accordance with a further aspect of the present invention, a method for driving a semiconductor memory device includes outputting a delay locked clock by delaying a system clock for a predetermined time in order to output a data synchronized with the system clock, controlling the proportion of high to low level periods of the delay locked clock, thereby outputting a first clock, outputting a second clock derived from the first clock, and synchronizing a first edge of the first clock and that of the second clock.

DESCRIPTION OF SPECIFIC EMBODIMENTS

A semiconductor memory device in accordance with the present invention is able to correct a duty cycle of a delay locked clock easily. Accordingly, a DDR synchronous semiconductor memory device is able to secure a maximum data output margin at both rising and falling edges of a system clock. More reliable semiconductor memory device is able to be provided.

Hereinafter, a semiconductor memory device in accordance with the present invention will be described in detail referring to the accompanying drawings.

Figure 1:
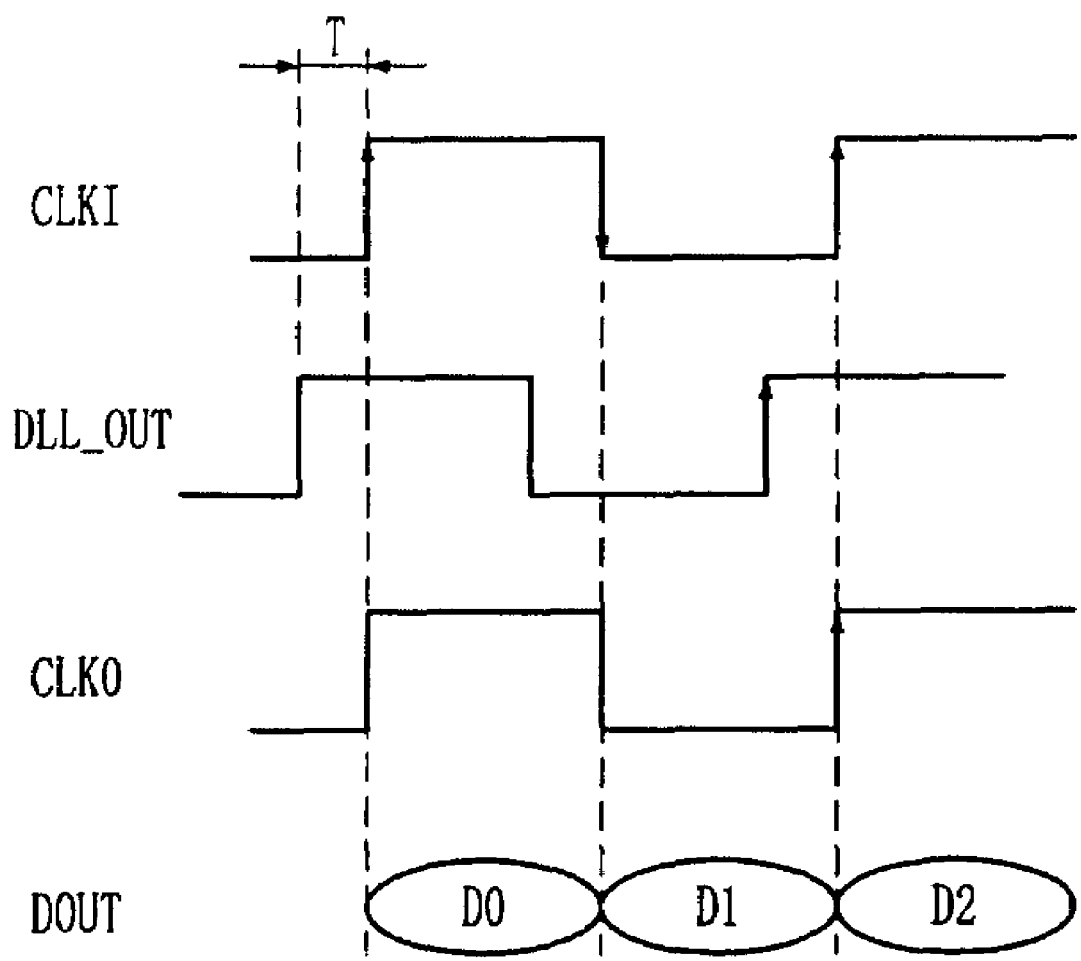
FIG. 1 is a signal timing diagram illustrating an operation of a conventional delay locked loop.
Figure 2:
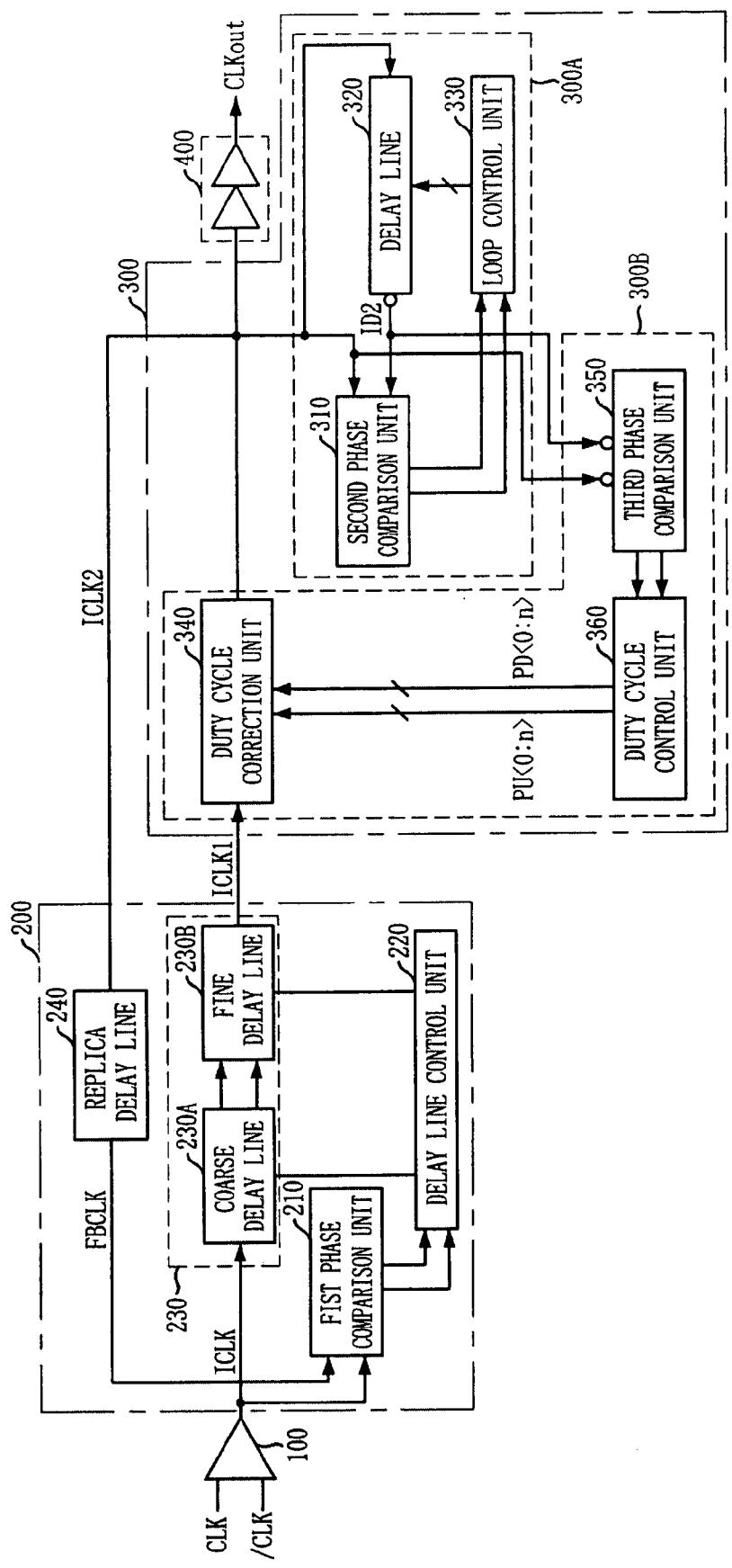
FIG. 2 is a block diagram illustrating a delay locked loop of a semiconductor memory device in accordance with the present invention.

FIG. 2 is a block diagram illustrating a delay locked loop (DLL) of a semiconductor memory device in accordance with the present invention. The DLL includes a clock input buffer 100, a delay locked block 200, a duty cycle correcting block 300 and a clock output buffer 400.

The clock input buffer 100 receives and buffers system clocks CLK and CLK/, thereby to output an internal clock ICLK to the delay locked block 200. The delay locked block 200 delays the internal clock ICLK for a predetermined time, in order for an output timing of a data to be synchronized with the system clocks CLK and CLK/.

The delay locked block 200 includes a first phase comparison unit 210, a delay line control unit 220, a delay line 230 and a replica delay unit 240. The first phase comparison unit 210 compares a phase between a feedback clock FBCLK and the internal clock ICLK buffered from the system clocks CLK and CLK/.

The delay line 230 includes a coarse delay line 230A and a fine delay line 230B. The coarse delay line 230A delays the internal clock ICLK for a predetermined time and outputs a delayed clock to a fine delay line 230B. The fine delay line 230B more delays the delayed clock, thereby to output a delay locked clock ICLK1 to a duty cycle correction unit 340. The coarse delay line 230A includes a chain of delay units. The delay line control unit 220 controls the number of the delay units through which the internal clock ICLK should passes. A delay time of the coarse delay line 230A is determined according to the number of the delay units through which the internal clock ICLK passes. The fine delay line 230B is a delay block for controlling a delay time fine. A delay time of delay units included in the fine delay line 230B is less than that of the coarse delay line 230A.

The delay line control unit 220 controls a delay time of the delay line 230 according to a comparison result of the first phase comparison unit 210. The replica delay unit 240 delays a first clock ICLK2 output from the duty cycle correction block 300 for a modeling delay time, thereby to output the feedback clock FBCLK. The modeling delay time is a time taken for the system clocks CLK and CLK/ to be transmitted to a data output circuit after an input of the system clocks into a semiconductor memory device. The replica delay 240 includes circuits similar to those that the system clocks CLK and CLK/ pass through from an input into the semiconductor memory device to an arrival at the data output circuit.

The duty cycle correction block 300 includes a clock synchronization circuit 300A and a duty cycle correction circuit 300B. The clock synchronization circuit 300A is a circuit for synchronizing a rising edge of the first clock ICLK2 with a rising edge of a second clock ID2 which is inverted from the first clock ICLK2. The duty cycle correction circuit 300B is a circuit for controlling the proportion of high and low level periods of the first clock ICLK2 according to a difference between falling edges of the first clock ICLK2 and the second clock ID2.

The clock synchronization circuit 300A includes a second phase comparison unit 310, a delay line 320 and a loop control unit 330. The second phase comparison unit 310 compares a rising edge of the first clock ICLK2 with a rising edge of the second clock ID2 which is output from the delay line 320. The delay line 320 delays the first clock ICLK2 in response to control of the loop control unit 330. The second clock ID2 has an inverted phase in contrast with the first clock ICLK2. The delay line 320 may include an inversion circuit inside. In an embodiment of the present invention, the delay line 320 has an inversion circuit apart from its output terminal. The loop control unit 330 controls a delay time of the delay line 320 in response to a comparison result of the second phase comparison unit 310.

The duty cycle correction circuit 300B includes a duty cycle correction unit 340, a third phase comparison unit 350 and a duty cycle control unit 360. When the first clock ICLK2 and the second clock ID2 are activated at an identical time, the third phase comparison unit 350 compares a rising edge of a third clock with a rising edge of a fourth clock and outputs a time difference between the rising edges of the third and fourth clocks. The third and fourth clocks are inverted from the first clock ICLK2 and the second clock ID2, respectively. The duty cycle control unit 360 outputs duty cycle control signals PU<0:N> and PD<0:N> corresponding to a comparison result of the third phase comparison unit 350. The duty cycle correction unit 340 controls the proportion of high and low level periods of the first clock ICLK2 in response to the duty cycle control signals PU<0:N> and PD<0:N>.

The first to third phase comparison units 210, 310 and 350 may be embodied in an identical structure. Accordingly, the first phase comparison unit 210 can be used as the second and the third phase comparison units 310 and 350. So the loop control unit 330 and the delay line control unit 220 may be. In addition, the duty cycle control unit 360 can be embodied by using the loop control unit 330 and the delay line control unit 220.

The delay lines 230 and 320 may be also embodied in an identical structure. However, a delay time of the delay line 320 can be less than that of the delay line 230. The delay line 320 includes less delay units than the delay line 230. It is possible that the delay line 320 includes a half of the delay units included in the delay line 230. The delay line 320 may include both or either of the coarse and fine delay lines. The delay line 230 is able to delay the internal clock ICLK by one clock period for a delay locked loop function. On the other hand, the delay line 320 delays the second clock ID2 to be synchronized with the first clock ICLK2 by a half clock period.

The clock output buffer 400 buffers the first clock ICLK2 output from the duty cycle correction unit 340, thereby to output an output clock CLKOUT. The output clock CLKOUT is complete in a delay locked loop function and a duty cycle correcting operation, and is a reference clock for outputting a data. A data output circuit of a semiconductor memory device outputs a data in response to the output clock CLKOUT.

Figure 3:
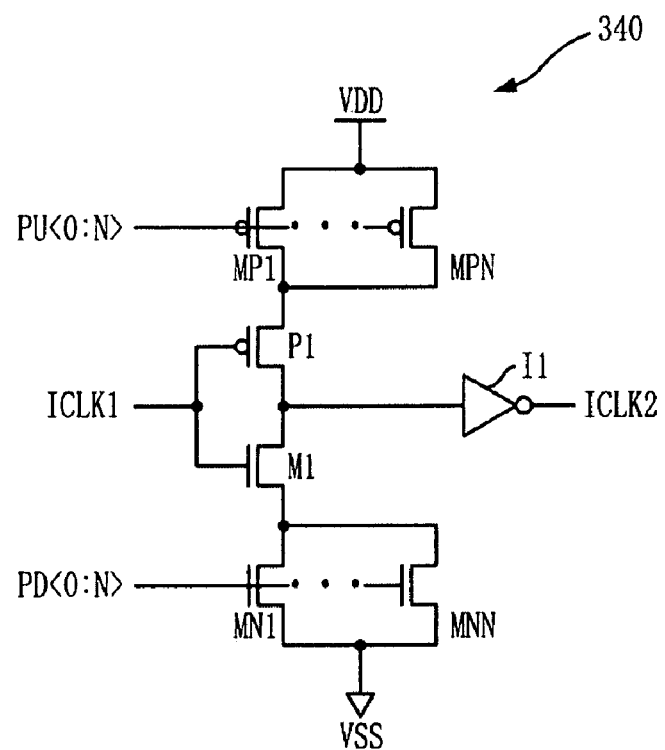
FIG. 3 is a schematic circuit diagram illustrating a duty cycle correction unit described in FIG. 2.

FIG. 3 is a schematic circuit diagram illustrating the duty cycle correction unit 340 described in FIG. 2. The duty cycle correction unit 340 includes a plurality of PMOS transistors MP1 to MPN, a plurality of NMOS transistors MN1 to MNN, PMOS and NMOS transistors P1 and M1, and a first inverter I1.

The plurality of PMOS transistors MP1 to MPN are provided in parallel. The plurality of PMOS transistors MP1 to MPN are selectively turned on in response to a plurality of duty cycle control signals PU<0:N>, thereby to control supply of a supply voltage VDD.

The PMOS transistor P1 receives the delay locked clock ICLK1 outputted from the delay line 230 through its gate. The PMOS transistor P1 is connected between the plurality of PMOS transistors MP1 to MPN and the NMOS transistor M1.

The NMOS transistor M1 receives the delay locked clock ICLK1 outputted from the delay line 230 through its gate. The NMOS transistor M1 is connected between the PMOS transistor P1 and the plurality of NMOS transistors MN1 to MNN.

The plurality of NMOS transistors MN1 to MNN are provided in parallel and connected between the NMOS transistor M1 and a ground voltage VSS. The plurality of NMOS transistors MN1 to MNN are selectively turned on in response to a plurality of duty cycle control signals PD<0:N>.

The first inverter I1 inverts a signal on a common node of the PMOS and NMOS transistors P1 and M1, thereby to output the first clock ICLK2.

The plurality of duty cycle control signals PU<0:N> and PD<0:N> of the duty cycle control unit 360 determine the number of PMOS transistors MP1 to MPN and NMOS transistors MN1 to MNN which are turned on. According to the number of PMOS transistors MP1 to MPN and NMOS transistors MN1 to MNN which are turned on, high and low level periods of an input signal, i.e., the delay locked clock ICLK1, are compensated. And then, the first clock ICLK2 is outputted.

Figure 4:
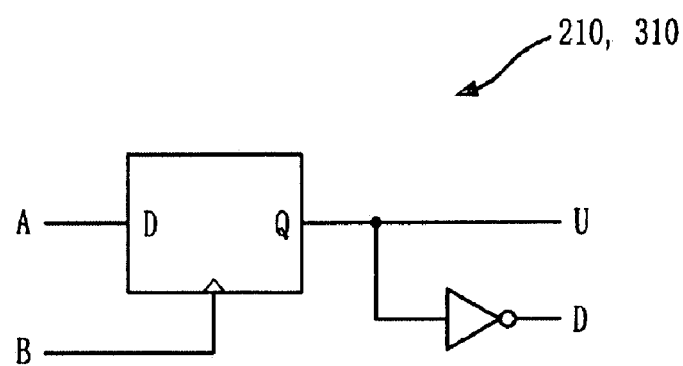
FIG. 4 is a block diagram illustrating a phase comparison unit described in FIG. 2.

FIG. 4 is a block diagram illustrating a phase, comparison unit described in FIG. 2. The phase comparison unit compares phases of two input signals A and B, thereby to output an up signal U or a down signal D.

A phase comparison unit for comparing phases of two input signals is able to be embodied variously. In the present invention, a D flip-flop is used as a simple example. The phase comparison unit described in FIG. 4 may be applied to each of the first to third phase comparison units 210, 310 and 350.

Figure 5:
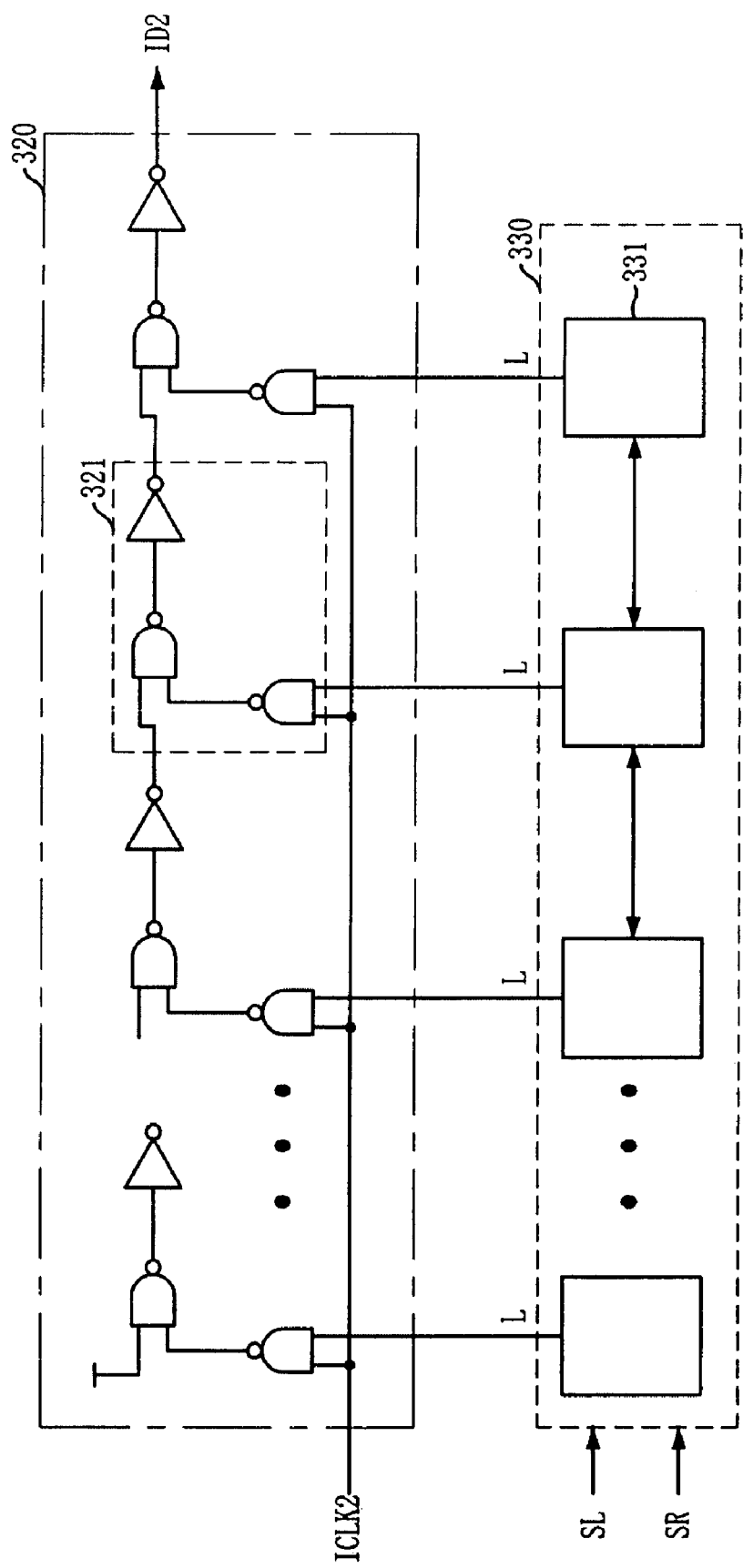
FIG. 5 is a block diagram illustrating a delay line and a loop control unit described in FIG. 2.

FIG. 5 is a block diagram illustrating the delay line 320 and the loop control unit 330 described in FIG. 2.

The delay line 320 includes a plurality of delay units chained. The loop control unit 330 includes a plurality of shift register unit. The loop control unit 330 shifts an output terminal outputting a high level signal according to a right shifting signal SR and a left shifting signal SL. The number of the delay units through which the first clock ICLK2 passes is determined according to a position of the output terminal outputting a high level signal. The right shifting signal SR and the left shifting signal SL may be the up signal U or the down signal D outputted from the phase comparison unit described in FIG. 4.

Figure 6:
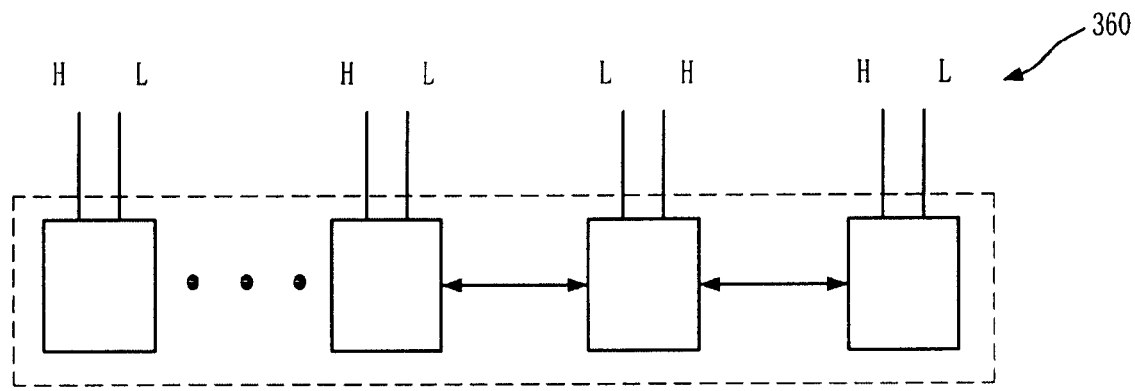
FIG. 6 is a block diagram illustrating a duty cycle control unit described in FIG. 2.

FIG. 6 is a block diagram illustrating the duty cycle control unit 360 described in FIG. 2.

The duty cycle control unit 360 has an identical circuit structure with the loop control unit 330 described in FIG. 5. However, because the duty cycle correction unit described in FIG. 3 is designed for inputting two kind of duty cycle control signals PU and PD, each shift register unit outputs two control signals. The duty cycle control unit 360 determines how many duty cycle control signals are outputted in a high or a low level according to a comparison result of the second phase comparison unit 350.

Figure 7:
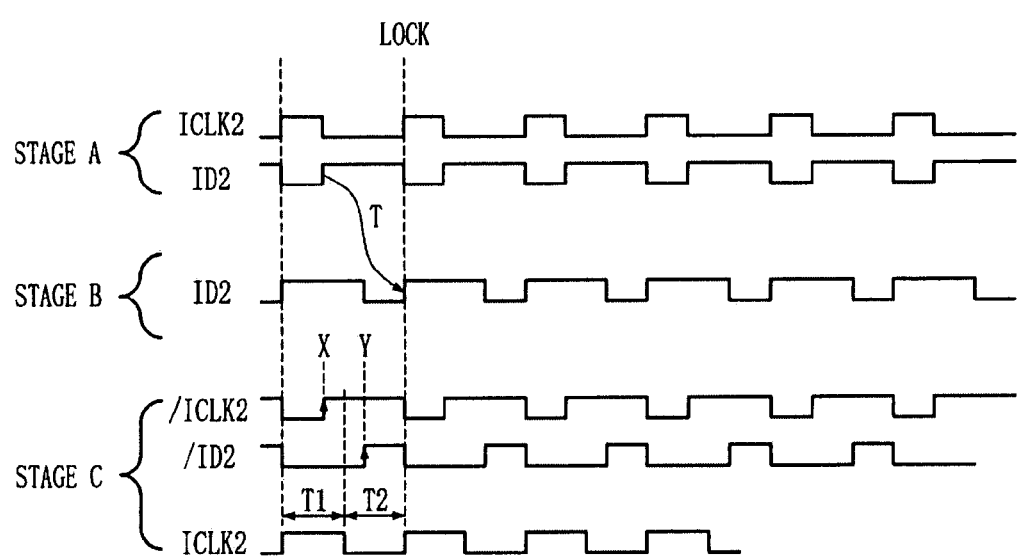
FIG. 7 is a signal timing diagram illustrating an operation of the semiconductor memory device described in FIG. 2.

FIG. 7 is a signal timing diagram illustrating an operation of the semiconductor memory device described in FIG. 2.

First of all, the delay locked block 200 performs a delay locked function until the internal clock ICLK is synchronized with the feedback clock FBCLK. The fact that the internal clock ICLK is synchronized with the feedback clock FBCLK means the internal clock ICLK is delayed to compensate an internal delay. The delay locked clock ICLK1 becomes the first clock ICLK2 through a duty cycle correcting operation.

Continuously, an operation of the duty cycle correction block 300 is described below. The delay line 320 inverts the first clock ICLK2 (Referring to a stage A described in FIG. 7) and delays it for a predetermined delay time, thereby to output the second clock ID2 (Referring to a stage B described in FIG. 7).

For an operation in the stage B, the second phase comparison unit 310 compares a rising edge of the first clock ICLK2 with a rising edge of the second clock ID2. The loop control unit 330 controls a delay time in the delay line 320 corresponding to difference between the rising edges of the first clock ICLK2 and the second clock ID2. The second phase comparison unit 310, the delay line 320 and the loop control unit 330 operate until the rising edge of the first clock ICLK2 becomes identical to that of the second clock ID2.

The third phase comparison unit 350 also compares a rising edge of a third clock /ICLK2 with a rising edge of a fourth clock /ID2 until the rising edge of the first clock ICLK2 becomes identical to that of the second clock ID2. The third clock /ICLK2 and the fourth clock /ID2 are inverted from the first clock ICLK2 and the second clock ID2, respectively. The duty cycle control unit 360 outputs a plurality of duty cycle control signals to the duty cycle correction unit 340 according to a comparison result of the third phase comparison unit 350. The duty cycle correction unit 340 controls high and low levels of the first clock ICLK2 to be in a proportion of 50 and 50.

The semiconductor memory device in accordance with the present invention includes the duty cycle correction block 300 in order to output a delay locked clock whose duty cycle is corrected. Most units in the duty cycle correction block 300 are used in the delay locked block 200. Though each of the second and third phase comparison units 310 and 350, the delay line 320, the loop control unit 330 and the duty cycle control unit 360 perform an unique function, the delay line 230, the first phase comparison unit 210 and the delay line control unit 220 used in the delay locked block 200 is able to embody those. Accordingly, a complicate and big size circuit usually used to correct a duty cycle, such as analog digital converter, is unnecessary in the present invention. The semiconductor memory device in the present invention easily performs a duty cycle correcting operation by supplementing minimum circuits.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
   a delay locked circuit for outputting a delay locked clock by delaying a system clock by a predetermined time;
   a duty cycle correction circuit for outputting a first clock by correcting a duty cycle of the delay locked clock, wherein the proportion of high to low level periods of the delay locked clock is controlled according to a time difference between a second edge of the first clock and that of a second clock derived from the first clock; and
   a clock synchronization circuit for synchronizing a first edge of the first clock with that of the second clock.

2. The semiconductor memory device of claim 1, wherein the clock synchronization circuit includes:
   a first delay line for delaying the first clock for a predetermined time;
   an inversion unit for outputting the second clock by inverting an output of the first delay line;
   a first phase comparison unit for comparing the first edge of the first clock with that of the second clock; and
   a loop control unit for controlling a delay time of the first delay line in response to the comparison result of the first phase comparison unit.

3. The semiconductor memory device of claim 2, wherein the duty cycle correction circuit includes:
   a second phase comparison unit for comparing the time of the second edge of the first clock with that of the second clock when the first edge of the first clock is synchronized with the first edge of the second clock;
   a duty cycle control unit for outputting duty cycle control signals corresponding to the comparison result of the second phase comparison unit; and
   a duty cycle correction unit for controlling the proportion of high to low level periods of the delay locked clock in response to the duty cycle control signals.

4. The semiconductor memory device of claim 3, wherein the delay locked circuit includes:
   a third phase comparison unit for comparing the system clock with a feedback clock;
   a second delay line for outputting the delay locked clock to the duty cycle correction circuit by delaying the system clock by the predetermined time;
   a delay line control unit for controlling a delay time of the second delay line according to the comparison result of the third phase comparison unit; and
   a replica delay unit for delaying the first clock output from the duty cycle correction circuit by a modeling delay time, thereby outputting the feedback clock.

5. The semiconductor memory device of claim 3, wherein the duty cycle correction unit includes:
   a plurality of first PMOS transistors connected to each other in parallel for being selectively turned on in response to the duty cycle control signals, thereby providing a supply voltage;
   a second PMOS transistor, connected between the plurality of first PMOS transistors and a first NMOS transistor, for receiving the delay locked clock output from the delay locked circuit through its gate;
   the first NMOS transistor, connected between the second PMOS transistor and a plurality of second NMOS transistors, for receiving the delay locked clock outputted from the delay locked circuit through its gate;
   the plurality of second NMOS transistors connected to each other in parallel between the first NMOS transistor and a ground voltage terminal for being selectively turned on in response to the duty cycle control signals; and
   an inverter for inverting a signal on a common node of the second PMOS and the first NMOS transistors, thereby outputting the first clock.

6. The semiconductor memory device of claim 4, wherein the delay time of the first delay line in the clock synchronization circuit is a half of the delay time of the second delay line in the delay locked circuit.

7. A semiconductor memory device, comprising:
   a first phase comparison unit for comparing a system clock with a feedback clock;
   a first delay line for outputting a delay locked clock by delaying the system clock by a predetermined time
   a delay line control unit for controlling a delay time of the first delay line according to the comparison result of the first phase comparison unit;
   a duty cycle correction unit for controlling the proportion of high to low level periods of the delay locked clock in response to duty cycle control signals, thereby outputting a first clock;
   a replica delay unit for delaying the first clock for a modeling delay time, thereby outputting the feedback clock;
   a clock synchronization unit for synchronizing a first edge of the first clock with that of a second clock derived from the first clock; and
   a duty cycle correction control unit for controlling the duty cycle correction unit according to a time difference between a second edge of the first clock and that of the second clock.

8. The semiconductor memory device of claim 7, wherein the clock synchronization unit includes:
   a second delay line for delaying the first clock by a predetermined time;
   an inversion unit for outputting the second clock by inverting an output of the second delay line;
   a second phase comparison unit for comparing the first edge of the first clock and that of the second clock; and
   a loop control unit for controlling a delay time of the second delay line in response to the comparison result of the second phase comparison unit.

9. The semiconductor memory device of claim 8, wherein the duty cycle correction control unit includes:
- a third phase comparison unit for comparing the time of the second edge of the first clock and that of the second clock when the first edge of the first clock is synchronized with that of the second clock;
- a duty cycle control unit for outputting the duty cycle control signals corresponding to the comparison result of the third phase comparison unit to the duty cycle correction unit.

10. A method for driving a semiconductor memory device, the method comprising:
- outputting a delay locked clock by delaying a system clock for a predetermined time in order to output a data synchronized with the system clock;
- controlling the proportion of high to low level periods of the delay locked clock, thereby outputting a first clock;
- outputting a second clock derived from the first clock; and
- synchronizing a first edge of the first clock with that of the second clock.

11. The method of claim 10, wherein the synchronizing the first edge of the first clock with that of the second clock includes:
- comparing the first edge of the first clock with that of the second clock; and
- delaying the first edge of the second clock according to the result of comparing the first edges.

12. The method of claim 11, wherein the controlling the proportion of the high to low level periods of the delay locked clock includes:
- comparing the time of the second edge of the first clock with that of the second clock when the first edge of the first clock is synchronized with that of the second clock; and
- controlling the proportion of the high to low level periods of the delay locked clock according to the result of comparing the timing.

* * * * *